United States Patent
Nakamura et al.

(10) Patent No.: US 9,773,767 B2
(45) Date of Patent: Sep. 26, 2017

(54) SEMICONDUCTOR DEVICE

(71) Applicant: FUJI ELECTRIC CO., LTD., Kawasaki-shi, Kanagawa (JP)

(72) Inventors: Yoko Nakamura, Matsumoto (JP); Norihiro Nashida, Nagano (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/850,339

(22) Filed: Sep. 10, 2015

(65) Prior Publication Data
US 2015/0380393 A1  Dec. 31, 2015

Related U.S. Application Data

(63) Continuation of application No. PCT/JP2014/002825, filed on May 28, 2014.

(30) Foreign Application Priority Data

May 30, 2013 (JP) .................. 2013-114270

(51) Int. Cl.
*H05K 7/00* (2006.01)
*H01L 25/18* (2006.01)
(Continued)

(52) U.S. Cl.
CPC .............. *H01L 25/18* (2013.01); *H01L 24/01* (2013.01); *H01L 24/33* (2013.01); *H01L 25/072* (2013.01);
(Continued)

(58) Field of Classification Search
CPC ......... H01L 2924/00; H01L 2924/1305; H01L 2924/15787; H01L 2224/06181;
(Continued)

(56) References Cited

U.S. PATENT DOCUMENTS 8,299,620 B2 *  10/2012  Tanaka .............. H01L 23/49524
                                                              257/691
8,410,591 B2 *   4/2013  Otremba ............. H01L 23/4952
                                                              257/676
(Continued)

FOREIGN PATENT DOCUMENTS

JP   H10-22602 A    1/1998
JP   2000-260822 A  9/2000
(Continued)

OTHER PUBLICATIONS

PCT, "International Search Report for International Application No. PCT/JP2014/002825".
(Continued)

*Primary Examiner* — Yuriy Semenenko
(74) *Attorney, Agent, or Firm* — Manabu Kanesaka

(57) ABSTRACT

A semiconductor device includes an insulating substrate including an insulating plate and a circuit plate disposed on a main surface of the insulating plate; a semiconductor chip having a front surface provided with an electrode and a rear surface fixed to the circuit plate; a printed circuit board facing the insulating substrate and including a metal layer; a conductive post having one end electrically and mechanically connected to the electrode and another end electrically and mechanically connected to the metal layer; a passive element fixed to the printed circuit board; and a plurality of positioning posts fixed to the printed circuit board to position the passive element.

6 Claims, 9 Drawing Sheets

(51) Int. Cl.
*H01L 23/00* (2006.01)
*H01L 25/07* (2006.01)
*H05K 1/02* (2006.01)
*H05K 1/18* (2006.01)
*H05K 3/28* (2006.01)
*H01L 23/31* (2006.01)
*H01L 23/373* (2006.01)
*H01L 23/498* (2006.01)
*H01L 23/40* (2006.01)
*H05K 1/14* (2006.01)

(52) U.S. Cl.
CPC ........... *H05K 1/0263* (2013.01); *H05K 1/181* (2013.01); *H05K 3/284* (2013.01); *H01L 23/3107* (2013.01); *H01L 23/3735* (2013.01); *H01L 23/4006* (2013.01); *H01L 23/49811* (2013.01); *H01L 23/49833* (2013.01); *H01L 23/49844* (2013.01); *H01L 24/32* (2013.01); *H01L 2224/06181* (2013.01); *H01L 2224/32225* (2013.01); *H01L 2224/32258* (2013.01); *H01L 2924/10253* (2013.01); *H01L 2924/10272* (2013.01); *H01L 2924/1203* (2013.01); *H01L 2924/1305* (2013.01); *H01L 2924/13055* (2013.01); *H01L 2924/13091* (2013.01); *H01L 2924/153* (2013.01); *H01L 2924/15787* (2013.01); *H01L 2924/30107* (2013.01); *H05K 1/144* (2013.01); *H05K 2201/10022* (2013.01); *H05K 2201/10166* (2013.01); *H05K 2201/10242* (2013.01)

(58) Field of Classification Search
CPC . H01L 2224/32225; H01L 2224/32258; H01L 23/3107; H01L 23/3735; H01L 23/4006; H01L 23/49811; H01L 23/49833; H01L 23/49844

See application file for complete search history.

(56) References Cited

U.S. PATENT DOCUMENTS

| | | | | |
|---|---|---|---|---|
| 9,035,438 | B2* | 5/2015 | Hayashi | H01L 23/34 257/666 |
| 9,059,153 | B2* | 6/2015 | Fukui | H01L 23/49513 |
| 9,095,054 | B1* | 7/2015 | Bourne | H01L 25/165 |
| 9,275,938 | B1* | 3/2016 | McPherson | H01L 23/051 |
| 9,407,251 | B1* | 8/2016 | Passmore | H05K 1/0243 |
| 9,426,883 | B2* | 8/2016 | McPherson | H05K 1/0296 |
| 2001/0033477 | A1 | 10/2001 | Inoue et al. | |
| 2004/0157410 | A1 | 8/2004 | Yamaguchi | |
| 2008/0047137 | A1* | 2/2008 | Asahi | H01R 13/2414 29/876 |

FOREIGN PATENT DOCUMENTS

| | | | |
|---|---|---|---|
| JP | 2002-083915 | A | 3/2002 |
| JP | 2004-221372 | A | 8/2004 |
| JP | 2004-228403 | A | 8/2004 |
| JP | 2004228403 | * | 8/2004 |
| JP | 2008-300434 | A | 12/2008 |
| JP | 2009-064852 | A | 3/2009 |

OTHER PUBLICATIONS

Japan Patent Office, "Office Action for Japanese Patent Application No. 2015-519650," Nov. 8, 2016.

* cited by examiner

Prior Art

SEMICONDUCTOR DEVICE

CROSS-REFERENCES TO RELATED APPLICATIONS

The present application is a Continuation Application of PCT International Application No. PCT/JP2014/002825 filed May 28, 2014, and claiming priority from Japanese Application No. 2013-114270 filed May 30, 2013, the disclosure of which is incorporated herein.

TECHNICAL FIELD

The present invention relates to a semiconductor device, such as a power device or a switching IC for a high frequency, and more particularly, to a power semiconductor module including a power semiconductor element.

BACKGROUND ART

Power semiconductor modules including power semiconductor elements, such as insulated gate bipolar transistors (IGBTs) or power MOSFETs, have been used in, for example, power conversion devices, uninterruptible power supple devices, machine tools, and industrial robots.

As the power semiconductor module, a semiconductor module 201 has been proposed which includes an insulating substrate 202, semiconductor chips 205, a printed circuit board 203, and conductive posts 211, as illustrated in FIGS. 9(a), 9(b) (for example, see Patent Document 1).

The semiconductor module 201 has a structure in which the insulating substrate 202 and the printed circuit board 203 facing the insulating substrate 202 are sealed by a sealing resin 204 and are integrated with each other. A plurality of semiconductor chips 205 is fixed to the upper surface of the insulating substrate 202.

The insulating substrate 202 includes an insulating plate 206, a metal plate 207 which is fixed to the rear surface of the insulating plate 206, and a circuit plate 208 which is fixed to the front surface of the insulating plate 206. The semiconductor chips 205 are fixed to the surface of the circuit plate 208 through solder 209.

The printed circuit board 203 includes a resin layer 213 which is provided in a central portion, metal layers 214 which are provided on the front and rear surface of the resin layer 213, and protective layers 215 which cover the metal layers 214. In addition, a plurality of through holes 210 is provided in the printed circuit board 203 and the conductive posts 211 are inserted into the through holes 210. The metal layers 214 and the conductive posts 211 are electrically connected to each other through a plated layer (not illustrated).

The conductive post 211 is electrically and mechanically connected to a front electrode of the semiconductor chip 205 through a soldering layer 212.

In addition, as illustrated in FIG. 9(a), a capacitor 216 and a resistor 217 are provided in a region other than the metal layer 214 on the front surface of the printed circuit board 203.

CITATION LIST

Patent Document

Patent Document 1: JP 2009-64852 A

DISCLOSURE OF THE INVENTION

Problem to be Solved by the Invention

However, in the example according to the related art illustrated in FIGS. 9(a), 9(b), the metal layer 214 is provided on the printed circuit board 203, and passive elements, such as the capacitor 216 and the resistor 217, are provided at predetermined positions other than the metal layer 214. In addition, a small land portion is not formed at the position where the passive element is formed on the printed circuit board. Therefore, when the passive elements are bonded in this state, it is difficult to position the passive elements. That is, in some cases, positional deviation occurs in the passive elements and the passive elements are not bonded at predetermined positions. As a result, a manufacturing failure occurs in the power semiconductor module.

The invention has been made in view of the above-mentioned problems and an object of the invention is to provide a semiconductor device which can facilitate the positioning of a passive element fixed to a printed circuit board.

Means for Solving Problem

In order to achieve the object, according to an aspect of the invention, there is provided a semiconductor device including: an insulating substrate including an insulating plate and a circuit plate that is provided on a main surface of the insulating plate; a semiconductor chip that has an electrode which is provided on a front surface and a rear surface which is fixed to the circuit plate; a printed circuit board that includes a metal layer and faces the insulating substrate; a conductive post that has one end which is electrically and mechanically connected to the electrode and the other end which is electrically and mechanically connected to the metal layer; a passive element that is fixed to the printed circuit board; and a plurality of positioning posts that is fixed to the printed circuit board to position the passive element.

Effect of the Invention

According to the invention, the positioning posts are provided around the passive element fixed to the printed circuit board. Therefore, it is possible to reliably position the passive element with ease and to improve the yield of a semiconductor device.

MODE(S) FOR CARRYING OUT THE INVENTION

Hereinafter, embodiments of the invention will be described with reference to FIGS. 1 to 8.

The term "electrical and mechanical connection" used in the present disclosure is not limited to a case in which target objects are connected to each other by direct bonding and includes a case in which target objects are connected to each other through a conductive bonder, such as solder or sintered metal.

Figure 2:
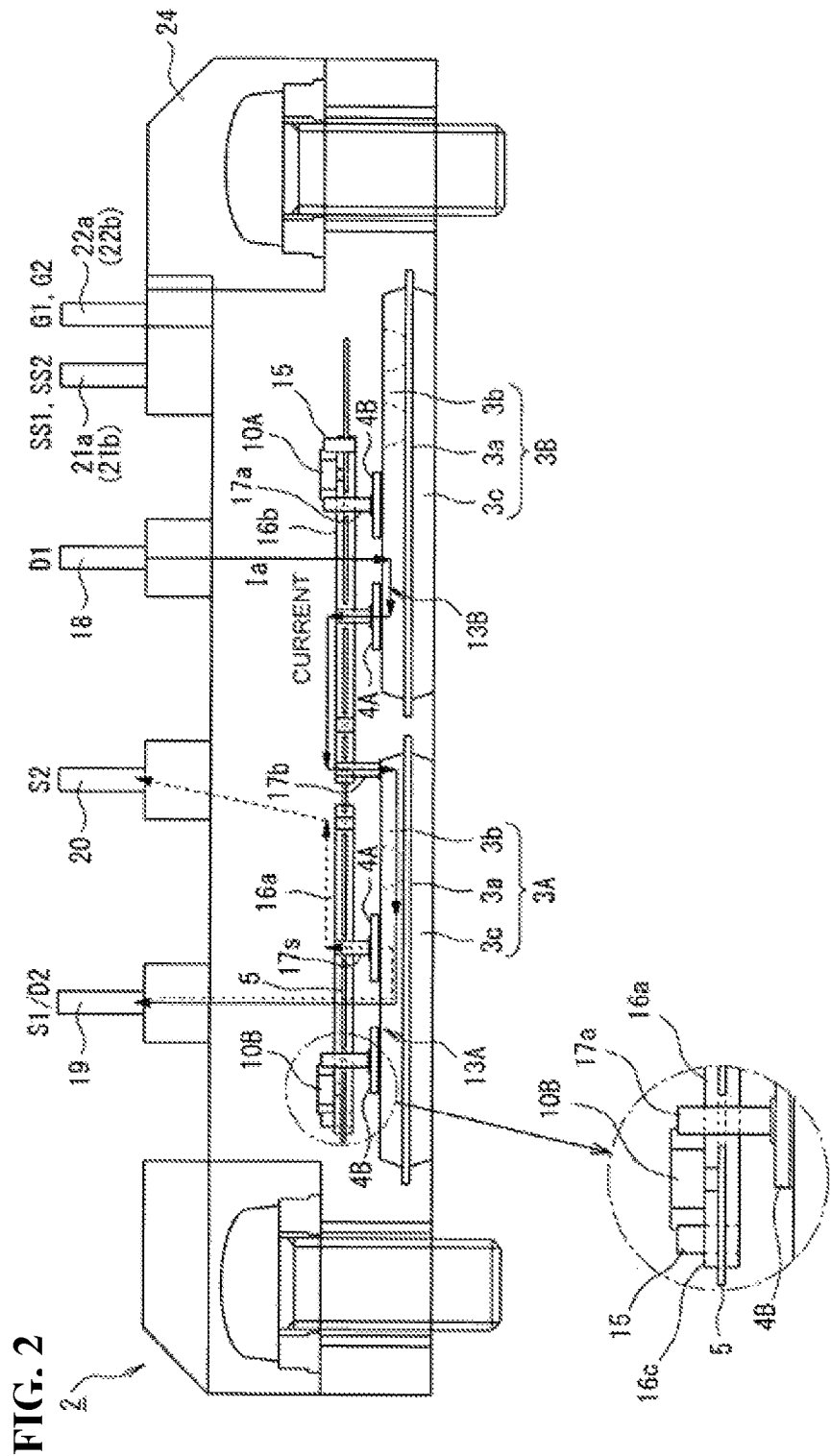
FIG. 2 is a vertical cross-sectional view illustrating the semiconductor device illustrated in FIG. 1.

As illustrated in FIG. 2, a power semiconductor module 2 as a semiconductor device according to the invention includes insulating substrates 3A and 3B, semiconductor chips 4A and 4B, a printed circuit board 5, cylindrical conductive posts 17a, 17b, and 17s, passive elements 10A and 10B, and positioning posts 15.

The first semiconductor chip 4A is a switching element such as a power MOSFET or an IGBT. The second semiconductor chip 4B is a free wheeling diode (FWD) which is connected in inverse parallel to the first semiconductor chip 4A.

Figure 3A:
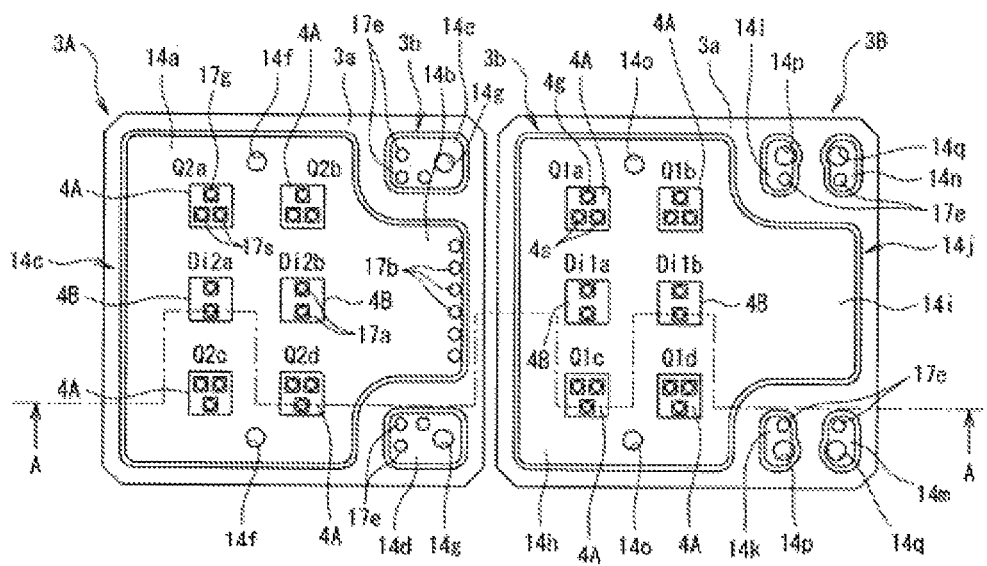
FIG. 3(a) is a plan view illustrating an insulating substrate illustrated in FIG. 2.

As illustrated in FIG. 3(a), two second semiconductor chips 4B are arranged on the center line of each of the insulating substrates 3A and 3B in the longitudinal direction at a predetermined interval. Four first semiconductor chips 4A are arranged outside the second semiconductor chips 4B at predetermined intervals.

Figure 3B:
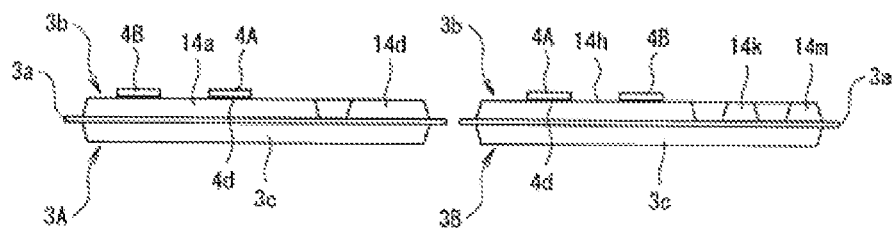
FIG. 3(b) is a side view illustrating the insulating substrate.
Figure 3C:
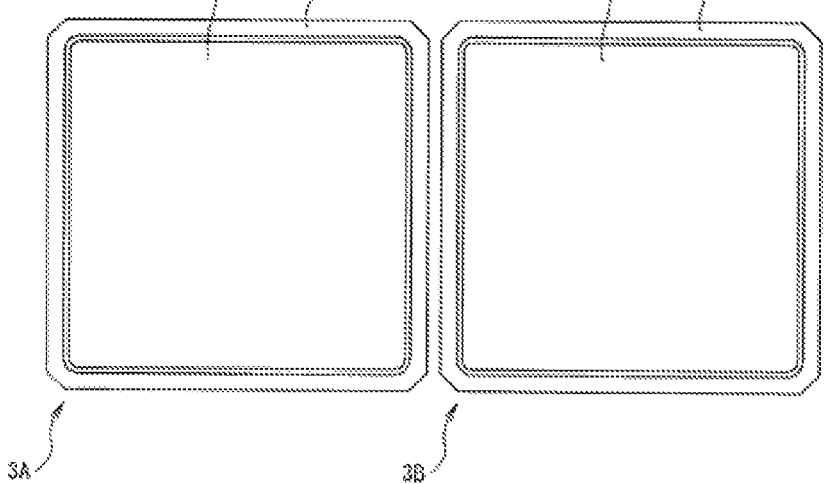
FIG. 3(c) is a bottom view illustrating the insulating substrate.

As illustrated in FIGS. 3(a) and 3(b), the first semiconductor chip 4A includes a drain electrode 4d which is provided on the rear surface side and a source electrode 4s and a gate electrode 4g which are provided on the front surface side. The gate electrode 4g is arranged at an end which is opposite to the second semiconductor chip 4B. The second semiconductor chip 4B includes a cathode electrode which is provided on the rear surface side and an anode electrode which is provided on the front surface side.

The semiconductor chips 4A and 4B are the above-mentioned various types of power devices. However, any semiconductor chips which are formed on a silicon substrate, a SiC substrate, or other substrates may be used.

The insulating substrate 3A includes a square-shaped insulating plate 3a, a circuit plate 3b which is fixed to a main surface of the insulating plate 3a, and a metal plate 3c which is fixed to a rear surface opposite to the main surface of the insulating plate 3a.

As illustrated in FIG. 3(a), the circuit plate 3b of the insulating substrate 3A includes a third circuit plate 14c for a drain electrode which includes a wide portion 14a and a narrow portion 14b and has a T-shape in a plan view.

In addition, the circuit plate 3b includes second circuit plates 14d and 14e for a source electrode which are provided outside the narrow portion 14b with a predetermined interval therebetween.

The third circuit plate 14c is electrically and mechanically connected to the drain electrode of the first semiconductor chip 4A and the cathode electrode of the second semiconductor chip 4B. Holes 14f into which external terminals 19, which are S1/D2 terminals, are inserted are provided in the third circuit plate 14c. In addition, holes 14g into which external terminals 20, which are S2 terminals, are inserted are provided in the second circuit plates 14d and 14e.

The insulating substrate 3B includes an insulating plate 3a, a circuit plate 3b, and a metal plate 3c, similarly to the insulating substrate 3A. The circuit plate 3b of the insulating substrate 3B includes a third circuit plate 14j for a drain electrode which includes a wide portion 14h and a narrow portion 14i and has a T-shape in a plan view. In addition, the circuit plate 3b includes circuit plates 14k, 14l, 14m, and 14n which are provided outside the narrow portion 14i of the third circuit plate 14j with a predetermined interval therebetween. Among them, the circuit plates 14k and 14l are fourth circuit plates for an auxiliary source electrode and the circuit plates 14m and 14n are first circuit plates for a gate electrode.

The third circuit plate 14j is electrically and mechanically connected to the drain electrode of the first semiconductor chip 4A and the cathode electrode of the second semiconductor chip 4B. Holes 14o into which external terminals 18, which are D1 terminals, are inserted are provided in the third circuit plate 14j. In addition, holes 14p into which external terminals 21a and 21b, which are SS1 and SS2 terminals, are inserted are provided in the fourth circuit plates 14k and 14l. Holes 14q into which external terminals 22a and 22b, which are G1 and G2 terminals, are inserted are provided in the first circuit plates 14m and 14n.

The external terminals 18, 19, 20, 21a, 21b, 22a, and 22b are preferably made of a copper-based or aluminum-based material with high conductivity. When the external terminals are soldered to the circuit plate 3b, it is effective to perform a surface treatment on the external terminals 18, 19, 20, 21a, 21b, 22a, and 22b with a nickel-based or tin-based material.

Figure 5:
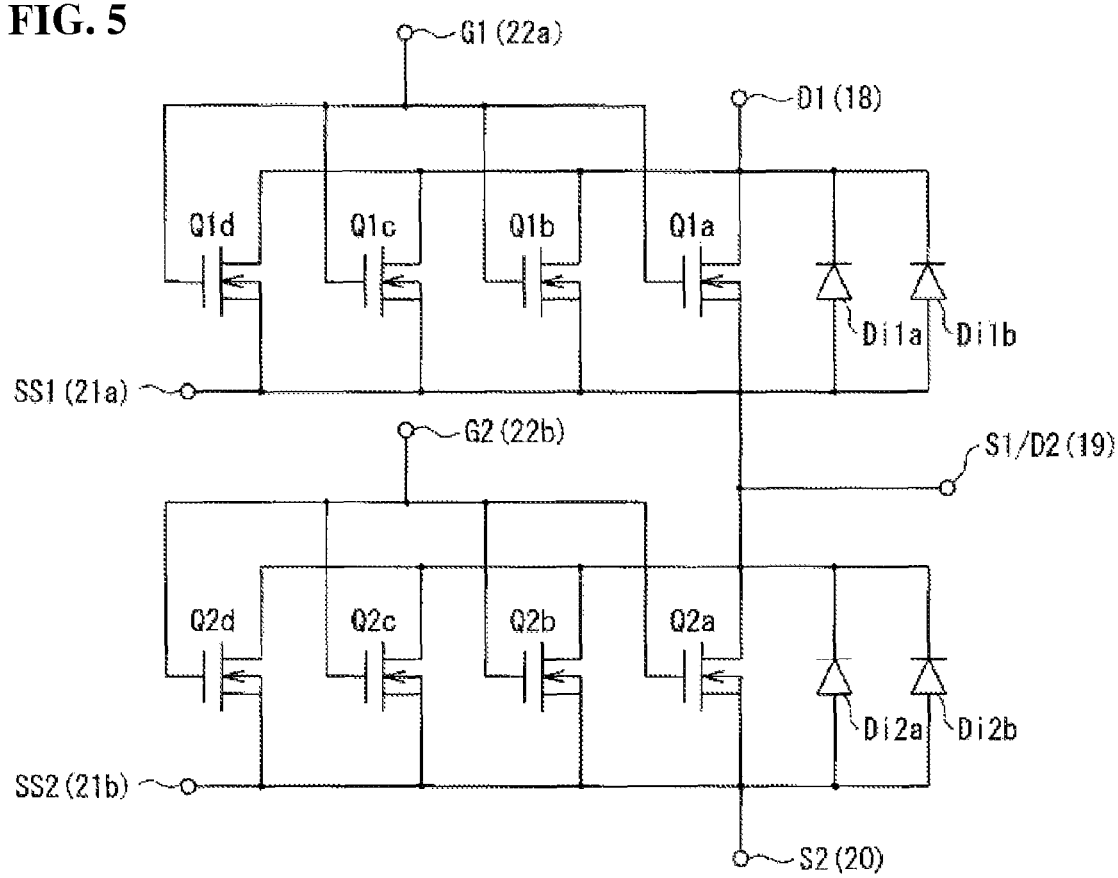
FIG. 5 is a circuit diagram illustrating an equivalent circuit of the semiconductor device illustrated in FIG. 2.

As can be seen from an equivalent circuit diagram illustrated in FIG. 5, the first semiconductor chips 4A (MOSFETs Q1a to Q1d) and the second semiconductor chips 4B (diodes Di1a and Di1b) forming an upper arm are connected in inverse parallel to the insulating substrate 3B. In addition, the first semiconductor chips 4A (MOSFETs Q2a to Q2d) and the second semiconductor chips 4B (diode Di2a and Di2b) forming a lower arm are connected in inverse parallel to the insulating substrate 3A.

Two sets of inverse parallel circuits formed on the insulating substrate 3B and the insulating substrate 3A are connected in series to each other through the printed circuit board 5 and the conductive posts 17b.

The drain electrodes 4d of the MOSFETs Q1a to Q1d are connected to the external terminals 18 forming the drain terminals D1 of the power semiconductor module 2 through the third circuit plate 14j. The drain electrodes 4d of the MOSFETs Q2a to Q2d are connected to the external terminals 19 forming the S1/D2 terminals of the power semiconductor module 2 through the third circuit plate 14c.

Figure 1:
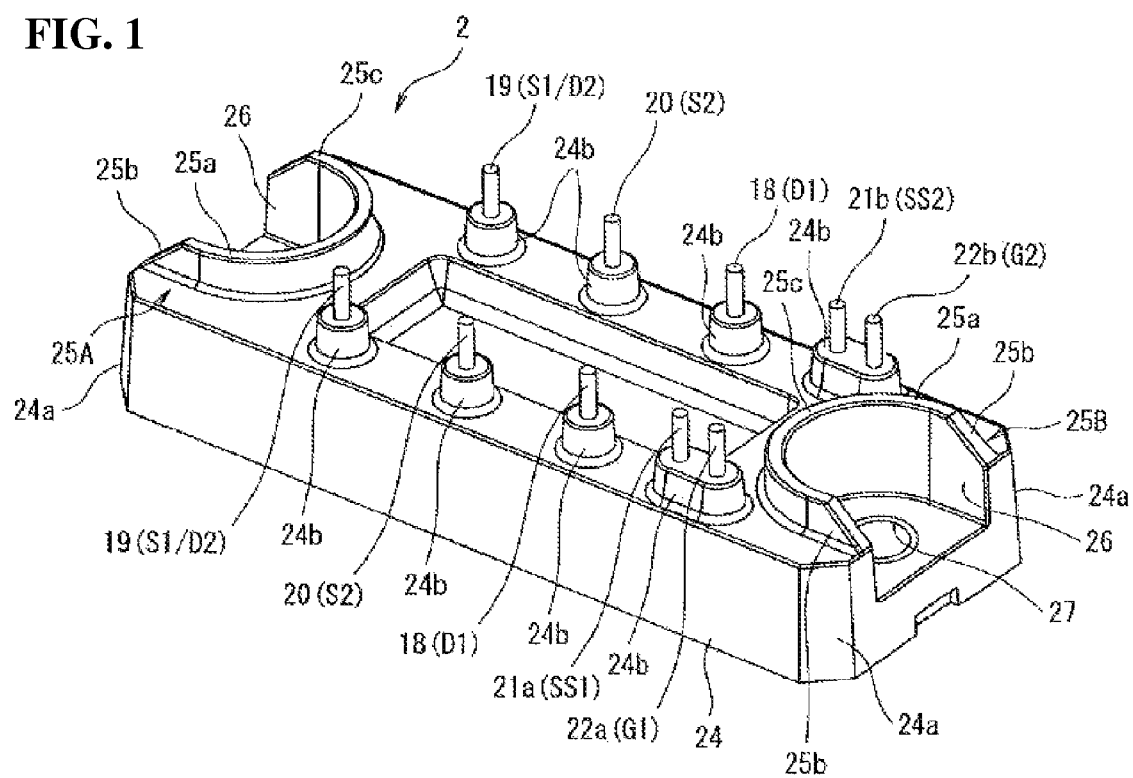
FIG. 1 is a perspective view illustrating a first embodiment of a semiconductor device according to the invention.

As illustrated in FIG. 1, two external terminals 18, two external terminals 19, and two external terminals 20 are arranged so as to be symmetric with respect to the center line of the power semiconductor module 2 in the width direction. In addition, the power semiconductor module 2 includes a total of four external terminals 21a, 21b, 22a, and 22b which are provided outside the external terminals 18 in the longitudinal direction. Two rows of the external terminals 18, 19, 20, 21a, 21b, 22a, and 22b are arranged in a substantially straight line along both side edges of the power semiconductor module 2.

The external terminals 21a and 21b are auxiliary source terminals and form current detection terminals SS1 and SS2 which sense a current flowing between the drain and source of each of the MOSFETs Q1a to Q1d and the MOSFETs Q2a to Q2d. The external terminals 22a and 22b form gate terminals G1 and G2 which supply a gate control signal to the gate electrode 4g of each of the MOSFETs Q1a to Q1d and the MOSFETs Q2a to Q2d in a half bridge circuit.

The metal plate 3c provided on the rear surface of each of the insulating substrates 3A and 3B has a lower surface that is flush with the bottom of an insulating resin 24 or slightly protrudes from the bottom of the insulating resin 24.

Figure 4A:
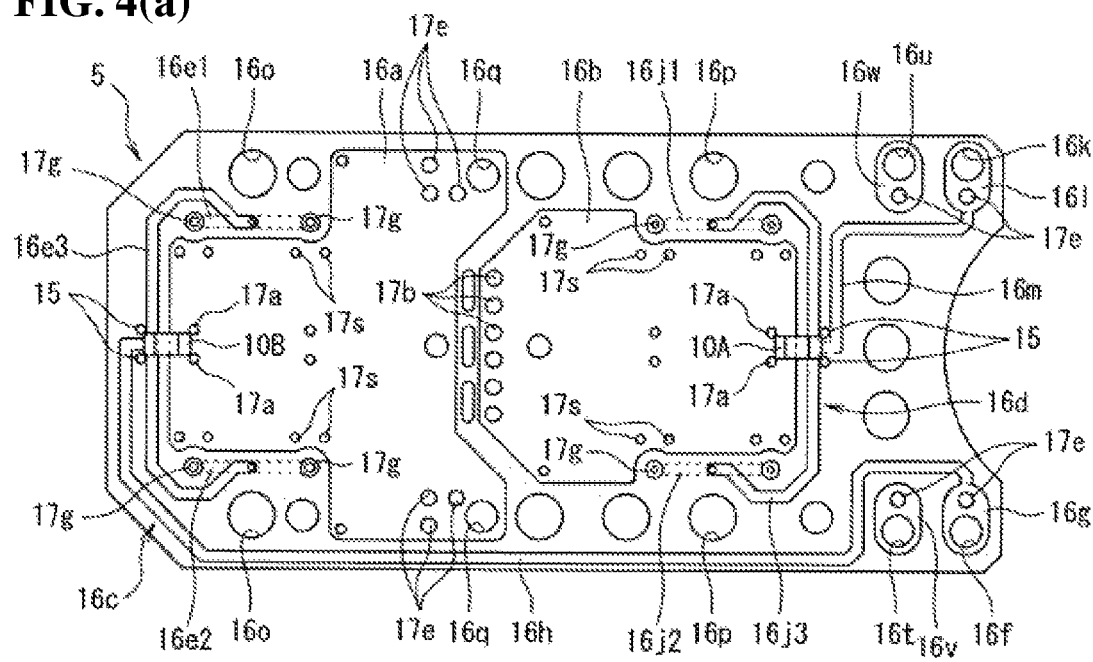
FIG. 4(a) is a plan view illustrating a printed circuit board illustrated in FIG. 2
Figure 4B:
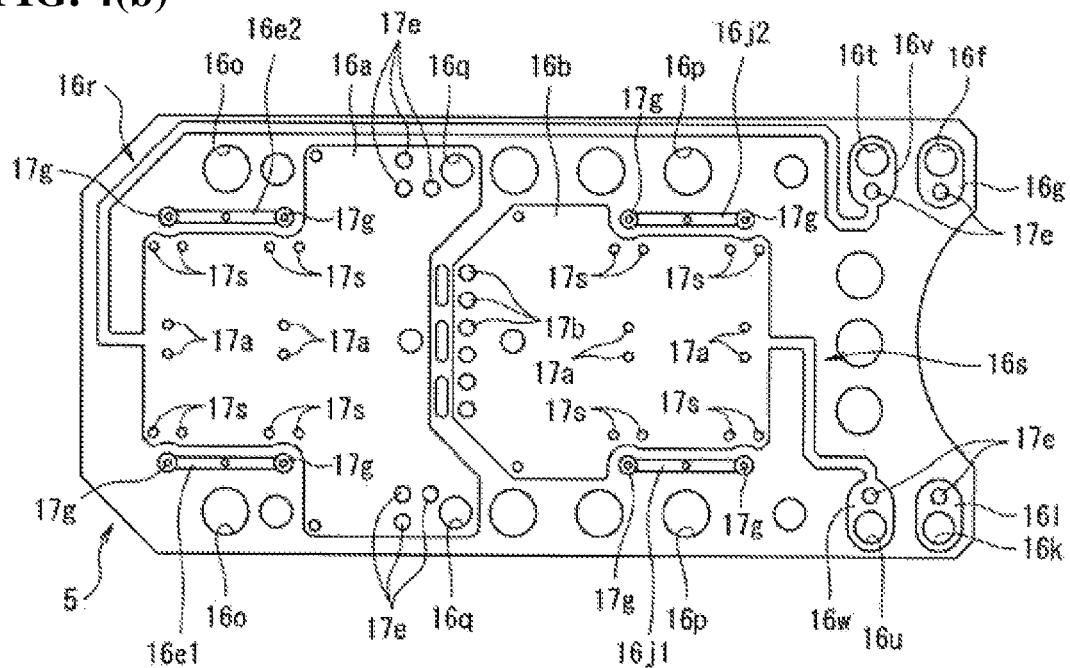
FIG. 4(b) is a bottom view illustrating the printed circuit board.

FIG. 4(a) illustrates the front surface of the printed circuit board 5 and FIG. 4(b) illustrates the rear surface of the printed circuit board 5. The printed circuit board 5 includes a second metal layer 16a which has a T-shape and functions as a current path of a lower arm portion 13A and a second metal layer 16b which functions as a current path of an upper arm portion 13B. The second metal layers 16a and 16b and the source electrodes 4s of the first semiconductor chips 4A in the lower arm portion 13A and the upper arm portion 13B are electrically and mechanically connected to both ends of the second conductive posts 17s. The second metal layers 16a on the front and rear surfaces of the printed circuit board 5 have the same potential. Similarly, the second metal layers 16b on the front and rear surfaces of the printed circuit board 5 have the same potential.

First metal layers 16c and 16d which are control circuits for the lower arm portion 13A and the upper arm portion 13B are provided on the front surface of the printed circuit board 5. The first metal layers 16c and 16d and the gate electrodes 4g of the first semiconductor chips 4A in the lower arm portion 13A and the upper arm portion 13B are electrically and mechanically connected to both ends of first conductive posts 17g.

The first metal layer 16c includes first metal layers 16e1, 16e2, 16e3, and 16h.

The first metal layer 16d includes first metal layers 16j1, 16j2, 16j3, and 16m.

As illustrated in FIGS. 4(a), 4(b), the first metal layer 16c is arranged such that the lengths of wires to the gate electrodes 4g of the MOSFETs Q1a to Q1d are equal to each other by the first metal layers 16e1 and 16e2. Similarly, the first metal layer 16d is arranged such that the lengths of wires to the gate electrodes 4g of the MOSFETs Q2a to Q2d are equal to each other by the first metal layers 16j1 and 16j2.

The printed circuit board 5 has through holes 16o, 16p, and 16q through which the external terminals 18, 19, and 20 pass without contacting the printed circuit board 5.

In addition, second metal layers 16r and 16s which function as the current paths of the lower arm portion 13A and the upper arm portion 13B are provided on the rear surface of the printed circuit board 5.

The second metal layers 16r and 16s are arranged so as to overlap the first metal layers 16c and 16d provided on the front surface in a plan view. The second metal layers 166r and 16s are electrically connected to second metal layers 16v and 16w.

As such, since the first metal layers 16h and 16m, which are gate lines, and the second metal layers 16r and 16s, which are source lines, are arranged at the positions that are opposite to each other, it is possible reduce the mutual inductance between the two types of metal layers. Since the mutual inductance is reduced, it is possible to stabilize the control of the MOSFETs Q1a to Q1d and the MOSFETs Q2a to Q2d.

The second metal layer 16b of the printed circuit board 5 is electrically connected to the third circuit plate 14c of the insulating substrate 3A by a plurality of conductive posts 17b and forms a current path between the lower arm portion 13A and the upper arm portion 13B.

The second metal layer 16a of the printed circuit board 5 is electrically connected to the second circuit plates 14d and 14e of the insulating substrate 3A through conductive posts 17e. The first metal layers 16g and 16l of the printed circuit board are electrically connected to the first circuit plates 14m and 14n of the insulating substrate 3B through the conductive posts 17e. The second metal layers 16v and 16w of the printed circuit board are electrically connected to the fourth circuit plates 14k and 14l of the insulating substrate 3B through the conductive posts 17e.

In addition, on the front surface of the printed circuit board 5, the capacitor 10A, which is a passive element, is electrically and mechanically connected between a connection region between the first metal layers 16j and 16m which are electrically connected to the gate electrode of the first semiconductor chip 4A in the upper arm portion 13B and the second metal layer 16b which is adjacent to the connection region.

Similarly, on the front surface of the printed circuit board 5, the capacitor 10B, which is a passive element, is electrically and mechanically connected between a connection region between the first metal layers 16h and 16e which are electrically connected to the gate electrode of the first semiconductor chip 4A in the lower arm portion 13A and the second metal layer 16a which is adjacent to the connection region.

The cylindrical positioning posts 15 are provided at each corner of the mounting position of each of the capacitors 10A and 10B on the front surface of the printed circuit board 5. In this embodiment, the conductive posts 17a are provided at the mounting position of the capacitor. Therefore, the conductive posts 17a protrude from the front surface of the printed circuit board 5 and are also used as conductor positioning posts.

The positioning posts 15 provided at each corner make it possible to easily position the capacitors 10A and 10B.

The capacitors 10A and 10B prevent the semiconductor device from being unintentionally turned on due to a rise in the gate voltage of each of the MOSFETs Q1a to Q1d and the MOSFETs Q2a to Q2d provided in the semiconductor chip 4A.

That is, one bridge circuit of the equivalent circuit illustrated in FIG. 5 will be described with reference to FIG. 6. The drain electrode D1 of the MOSFET Q1 forming the upper arm is connected to a DC power supply (not illustrated). In addition, a source electrode S1 is connected to the drain electrode D2 of the MOSFET Q2 forming the lower arm. A gate electrode G2 of the MOSFET Q2 is connected to a negative electrode of a bias power supply B through gate resistance R and wiring inductance L. A source electrode S2 of the MOSFET Q2 is connected to a positive electrode of the bias power supply B and the ground.

Figure 6:
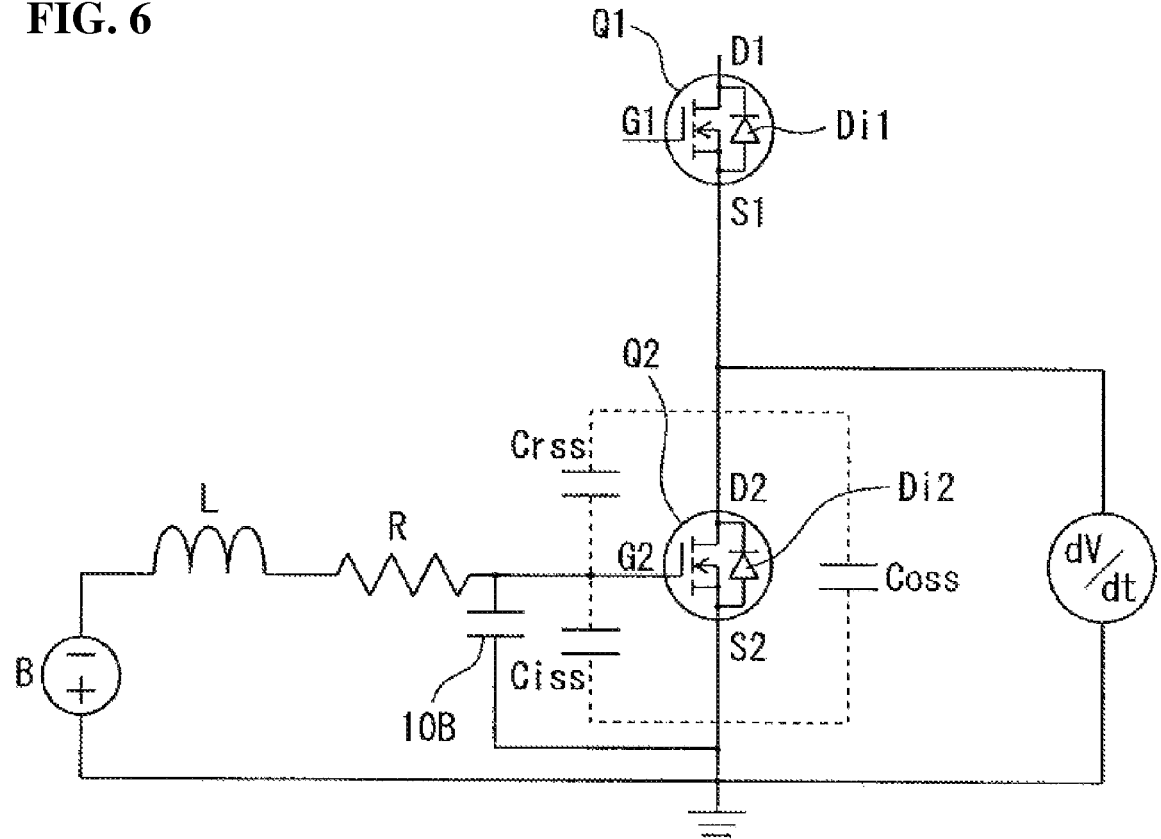
FIG. 6 is a circuit diagram illustrating an equivalent circuit for describing a gate voltage variation.

In the equivalent circuit illustrated in FIG. 6, when the MOSFET Q2 of the lower arm is turned off and the MOSFET Q1 of the upper arm is turned on, a parasitic diode Di2 of the MOSFET Q2 in the lower arm is reversely recovered and the drain voltage of the lower arm increases rapidly. The gate potential of the MOSFET Q2 is increased by a current, which is a value obtained by multiplying the feedback capacitance Crss of the MOSFET Q2 in the lower arm by the gradient (dV/dt) of the increase in the voltage. When the gate potential of the MOSFET Q2 is greater than a threshold voltage, the MOSFET Q2 is unintentionally turned on. That is, since both the MOSFETs Q1 and Q2 are turned on, the bridge circuit is short-circuited.

The details are as follows. As illustrated in FIG. 6, in the MOSFET Q2, the feedback capacitance (reverse transfer capacitance) Crss is parasitic between the gate electrode and the drain electrode, input capacitance Ciss is parasitic between the gate electrode and the source electrode, and output capacitance Coss is parasitic between the drain electrode and the source electrode. Therefore, the gate resistance R, the inductance L of the gate line, and the parasitic capacitances Ciss and Crss are connected to the gate electrode and form a series RLC circuit. Therefore, a potential variation ΔVg occurs due to the oscillation of the series RLC circuit. When a value (Vg+ΔVg) obtained by adding the potential variation ΔVg to the gate potential Vg is greater than a threshold voltage Vth, the MOSFET Q2 is unintentionally turned on and the upper and lower arms are short-circuited.

It was found that the connection of a passive element (here, the capacitor 10B) exhibiting a current bypass effect between the gate and source of the MOSFET Q2 was effective in preventing the MOSFET Q2 of the lower arm from being unintentionally turned on.

In addition, it was found that the inductance L of the gate line was reduced in order to further improve the current bypass effect. The inductance L of the gate line is represented by the sum of the internal wiring inductance of the power semiconductor module 2 and the wiring inductance of a driving circuit. Therefore, it is effective to minimize the internal wiring inductance of the power semiconductor module 2.

Therefore, as in this embodiment, when the first metal layer with a large width and a thick conductive post are used as the gate line, it is possible to suppress the internal wiring inductance to, for example, 1 nH to 2 nH. That is, it is possible to significantly reduce the inductance of the gate line, as compared to the structure in which a bonding wire is used as the gate line.

Therefore, according to this embodiment, it is possible to effectively exhibit the current bypass effect of the passive element (capacitor 10B). Therefore, it is possible to reliably prevent the MOSFET Q2 from being unintentionally turned on.

The unintentional turn-on also occurs when the MOSFET Q1 of the upper arm is turned off and the MOSFET Q2 of the lower arm is turned on. Therefore, it is effective to connect the capacitor 10A for preventing the unintentional turn-on between the gate electrode G1 and source electrode S1 of the MOSFET Q1.

Next, a process for manufacturing the power semiconductor module 2 will be described.

The ends of the conductive posts 17a, 17b, 17e, 17g, and 17s are electrically and mechanically connected to predetermined positions of the printed circuit board 5 which is prepared in advance.

At the same time, solder paste is applied onto the first semiconductor chips 4A, the second semiconductor chips 4B, and the circuit plate 3b. Then, solder paste is applied onto the front surfaces (portions to which the conductive posts 17a, 17b, and 17s are connected) of the first semiconductor chips 4A and the second semiconductor chips 4B. In addition, solder paste is applied onto the connection region between the first metal layers 16j and 16m for fixing the capacitor 10A and the second metal layer 16b which is adjacent to the connection region. Solder paste is applied on to the connection region between the first metal layers 16e and 16h for fixing the capacitor 10B and the second metal layer 16a which is adjacent to the connection region. The external terminal 18, 19, 20, 21a, 21b, 22a, and 22b are inserted into predetermined holes provided in the insulating substrates 3A and 3B and are vertically held.

Figure 7:
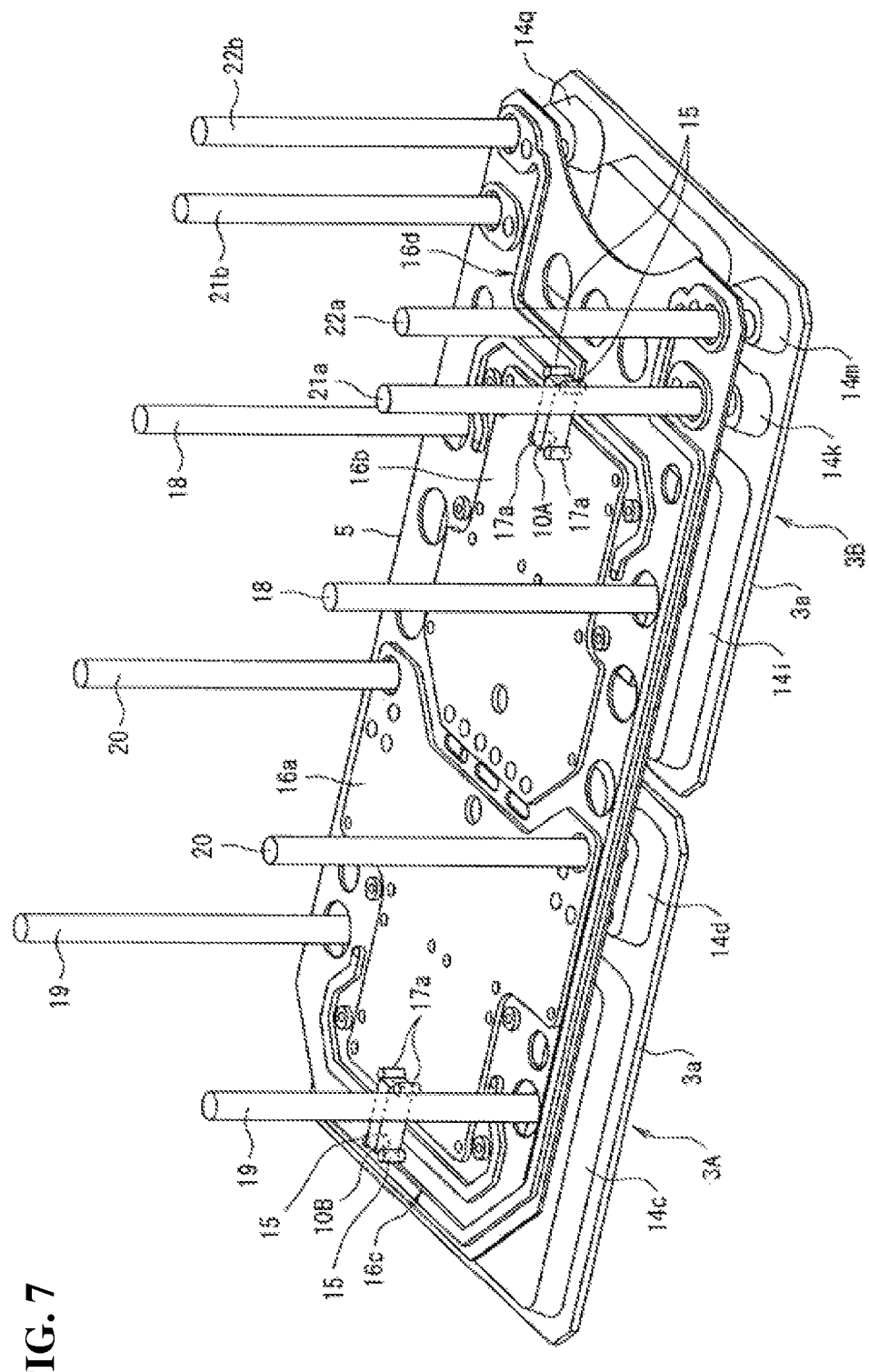
FIG. 7 is a perspective view illustrating a state in which the printed circuit board is mounted above the insulating substrate.
Figure 8:
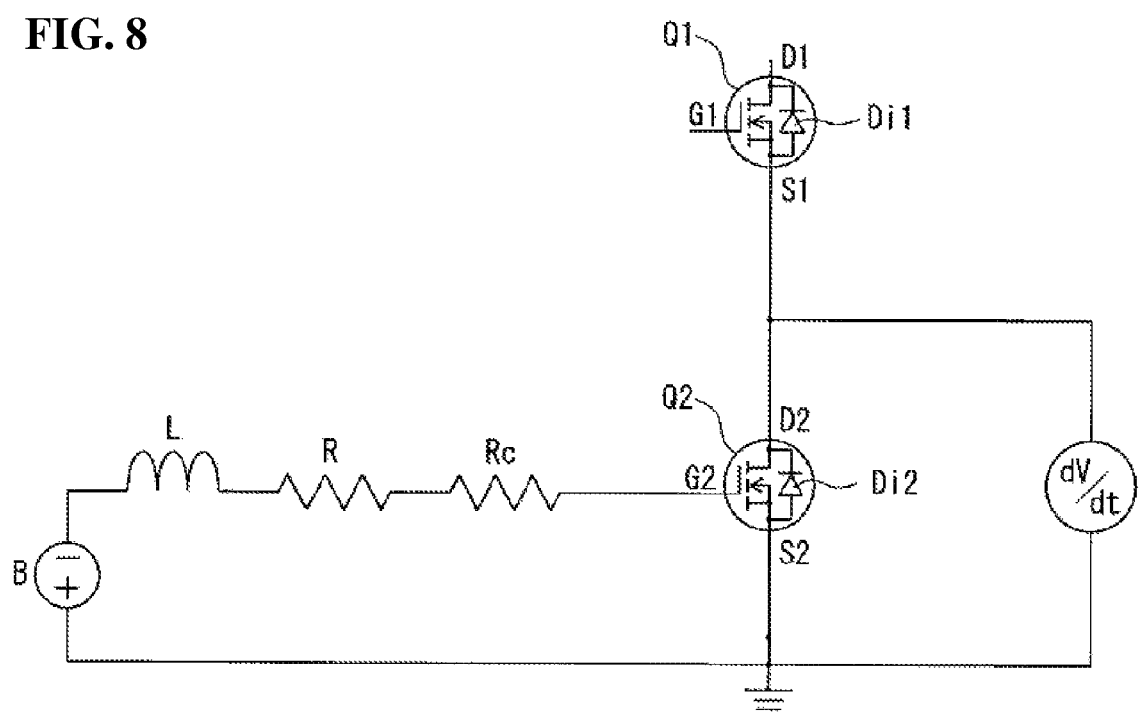
FIG. 8 is a circuit diagram illustrating an equivalent circuit of another embodiment of the semiconductor device according to the invention.
Figure 9A:
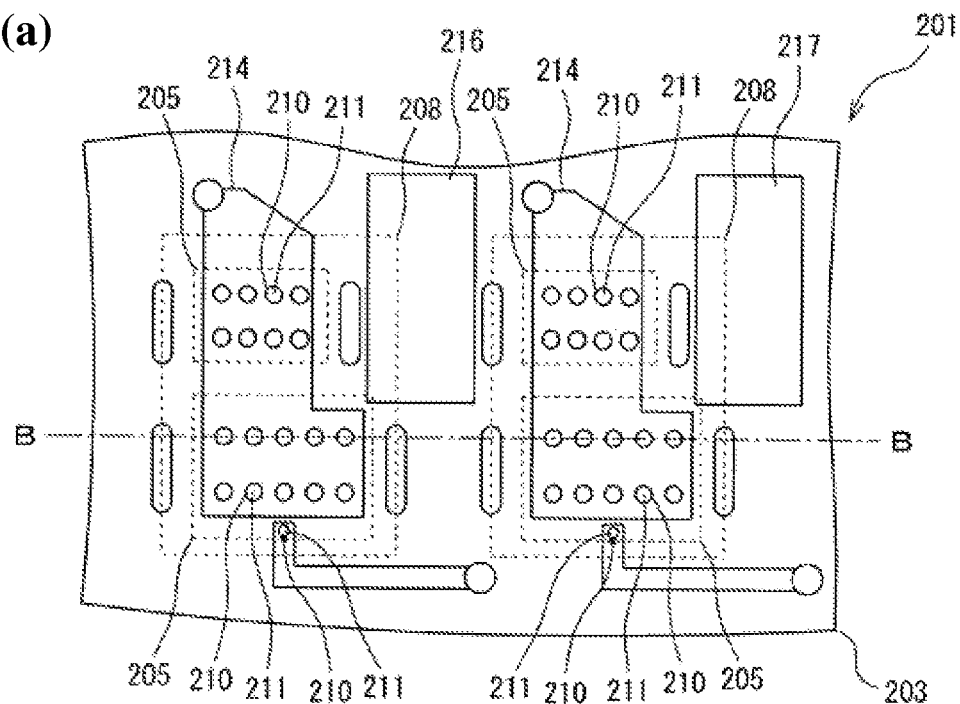
FIG. 9(a) is a plan view illustrating the related art and FIG. 9(b) is a cross-sectional view taken along the line B-B of FIG. 9(a).
Figure 9B:
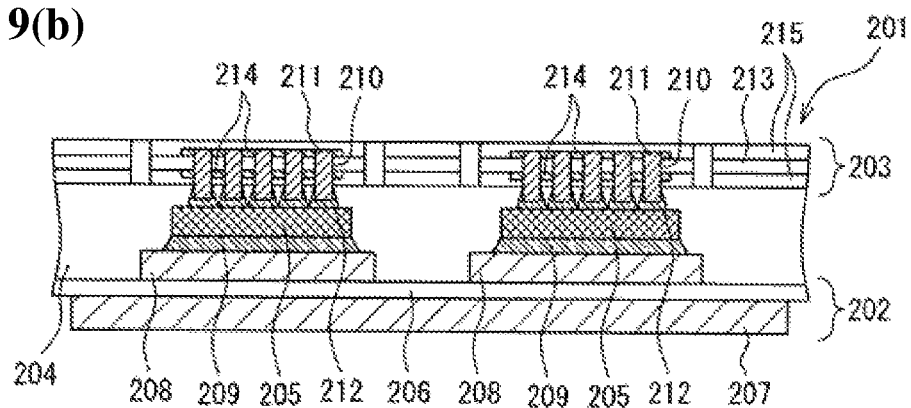

As illustrated in FIG. 7, the printed circuit board 5 is arranged above the insulating substrates 3A and 3B such that the conductive posts 17a, 17b, 17e, 17g, and 17s face the insulating substrates 3A and 3B. In addition, the capacitors 10A and 10B are arranged at predetermined positions of the printed circuit board 5.

In this state, a reflow process is performed to electrically and mechanically connect the ends of the conductive posts 17a, 17b, 17e, 17g, and 17s to the first semiconductor chips 4A, the second semiconductor chips 4B, and the circuit plate 3b. In addition, the capacitors 10A and 10B are electrically connected between the first metal layers 16c and 16d and the second metal layers 16a and 16b.

In the invention, before the reflow process is performed on the capacitors 10A and 10B, the positioning posts 15 and the conductive posts 17a which function as positioning posts are arranged at four corners of the capacitors 10A and 10B (the conductive posts 17a may be connected at the same time as the conductive posts 17a, 17b, 17e, 17g, and 17s are connected to the printed circuit board 5). Therefore, it is possible to accurately position the capacitors 10A and 10B. In addition, since solder is drawn to the positioning posts by a capillary phenomenon during the reflow process, it is possible to form a good solder fillet. As a result, it is possible to improve the mounting quality of the capacitors 10A and 10B.

As such, after the insulating substrates 3A and 3B and the printed circuit board 5 are electrically and mechanically connected to each other, they are placed into a mold (not illustrated) and an epoxy resin material, such as a thermosetting resin, is injected into the mold. Then, the insulating resin 24 having the rectangular parallelepiped shape illustrated in FIG. 1 is formed as the outward shape of the power semiconductor module 2. The power semiconductor module 2 is manufactured by these processes.

As illustrated in FIG. 1, insulating wall portions 25A and 25B are formed at both ends of the insulating resin 24 in the longitudinal direction.

In addition, attachment holes 27 are provided at the bottoms of concave portions 26 forming the insulating wall portions 25A and 25B so as to pass through the bottom of the insulating resin 24.

The external terminals 21a, 21b, 22a, and 22b of the power semiconductor module 2 having the above-mentioned structure are connected to a driving circuit to form one phase of an inverter circuit. In addition, three power semiconductor modules can be combined with each other to form a three-phase (U, V, and W) inverter circuit.

As such, according to the above-described embodiment, even when a connection pad is not provided at a capacitor mounting position on the front surface of the printed circuit board 5, it is possible to accurately position the capacitor with the positioning posts 15.

In the above-described embodiment, two conductive posts 17a and two positioning posts 15 are used to position the passive element. However, the invention is not limited thereto. For example, four positioning posts 15 may be used to position the passive element. In this case, the mounting position of the passive element on the printed circuit board 5 can be determined independently of the position of the conductive posts. Therefore, flexibility in the mounting position of the passive element is improved. In addition, four conductive posts 17 may be used to position the passive element. In this case, it is not necessary to provide a new positioning post. Therefore, it is possible to reduce manufacturing costs.

In the above-described embodiment, the capacitors 10A and 10B are used as the passive elements. However, the invention is not limited thereto. For example, the invention can also be applied to a case in which a resistor Rc for adjusting the control timing of the MOSFET Q2 mounted on the insulating substrate 3A is mounted on the front surface of the printed circuit board 5, as illustrated in the equivalent circuit of FIG. 8.

In the above-described embodiment, the insulating substrates 3A and 3B are provided in the lower arm portion 13A and the upper arm portion 13B, respectively. However, the invention is not limited thereto. For example, when the difference between the linear expansion coefficients of the insulating substrate and the insulating resin is not a problem, a circuit plate 3b for the lower arm portion 13A and the upper arm portion 13B may be provided on one insulating plate 3a and a common metal plate 3c may be provided.

In the above-described embodiment, the insulating substrates 3A and 3B are not limited to the above-mentioned structure. For example, a so-called active metal brazing (AMB) substrate obtained by brazing ceramics and copper and patterning copper using etching or a direct copper Bonding DCB) substrate obtained by directly bonding a ceramics substrate and copper may be used. For example, an alumina ($Al_2O_3$) plate, an aluminum nitride (AlN) plate, or a silicon nitride ($Si_3N_4$) plate may be used as the insulating plate 3a. In addition, a resin substrate may be used as the insulating plate 3a. That is, any substrate may be used as long as it can ensure an insulating performance.

In the above-described embodiment, the conductive posts 17a, 17b, 17e, 17g, and 17s have a cylindrical shape. However, the invention is not limited thereto. For example, the conductive posts may have any shape, such as a quadratic prism shape, a triangular prism shape, a polygonal prism shape, or an elliptical cylinder shape. That is, the conductive posts may have any shape which can contribute to a reduction in inductance. Similarly, the positioning post 15 is not limited to the cylindrical shape, but may have any shape, such as a quadratic prism shape, a triangular prism shape, a polygonal prism shape, or an elliptical cylinder shape. The positioning post 15 does not need to be a current path. Therefore, the positioning post 15 may be made of an insulator.

In the above-described embodiment, all of the external terminals are attached to the insulating substrate. However, the invention is not limited thereto. The external terminal, such as the gate terminal or the source auxiliary terminal through which a large amount of current does not flow, may be directly attached to the printed circuit board.

In the above-described embodiment, the power MOSFET is used as the first semiconductor chip 4A. However, the invention is not limited thereto. The first semiconductor chip 4A may be an IGBT. In this case, the source electrode and the drain electrode in the above-described embodiment may be replaced with an emitter electrode and a collector electrode, respectively. In addition, a voltage-controlled semiconductor element may be used.

In the above-described embodiment, both the first semiconductor chips 4A (MOSFETs) and the second semiconductor chips 4B (diodes) are arranged on the insulating substrates 3A and 3B. However, the invention is not limited thereto. For example, when a diode having a MOSFET provided therein can be used or when a synchronous rectification method is used, the second semiconductor chip 4B may be omitted and only the first semiconductor chip 4A may be provided. In addition, only the first semiconductor chip 4A, which is a reverse conducting IGBT (RC-IGBT) obtained by integrating an IGBT and an FWD into one chip, may be used.

In the above-described embodiment, the external terminal has a rod shape. However, a lead frame or a terminal with other shapes may be used as the external terminal. In the above-described embodiment, the external terminal protrudes from the upper surface of the power semiconductor module 2. However, the external terminal may protrude from the side surface of the power semiconductor module 2 and may be bent upward.

In the invention, a desired circuit structure is obtained only by a combination of the connections of the terminals of the semiconductor module. Therefore, the invention is not limited to the above-mentioned inverter device for power conversion. For example, the invention can be applied to other power conversion apparatuses using the power semiconductor module or other semiconductor devices, such as switching ICs for a high frequency.

EXPLANATIONS OF LETTERS OR NUMERALS

2 POWER SEMICONDUCTOR MODULE
3A, 3B INSULATING SUBSTRATE
3a INSULATING PLATE
3b CIRCUIT PLATE
3c METAL PLATE
4A FIRST SEMICONDUCTOR CHIP
4B SECOND SEMICONDUCTOR CHIP
5 PRINTED CIRCUIT BOARD
10A, 10B PASSIVE ELEMENT (CAPACITOR)
13A LOWER ARM PORTION
13B UPPER ARM PORTION
14 CIRCUIT PLATE
15 POSITIONING POST
16 METAL LAYER
17a, 17b, 17e, 17g, 17s CONDUCTIVE POST
18, 19, 20, 21a, 21b, 22a, 22b EXTERNAL TERMINAL
24 INSULATING RESIN

What is claimed is:
1. A semiconductor device comprising:
an insulating substrate including an insulating plate and a circuit plate disposed on a main surface of the insulating plate;
a semiconductor chip having a front surface provided with an electrode and a rear surface fixed to the circuit plate;
a printed circuit board facing the insulating substrate and including a metal layer;
a conductive post having one end electrically and mechanically connected to the electrode, and another end electrically and mechanically connected to the metal layer;
a passive element fixed to the printed circuit board; and
a plurality of positioning posts formed from a conductor and fixed to the printed circuit board to position the passive element, at least one positioning post of the plurality of positioning posts being integrally formed with the conductive post.
2. The semiconductor device according to claim 1, wherein the semiconductor chip includes a switching element.

3. The semiconductor device according to claim 2, wherein the passive element includes a capacitor for suppressing a variation in a control voltage of the semiconductor chip.

4. The semiconductor device according to claim 2, wherein the passive element includes a resistor for adjusting a control timing of the semiconductor chip.

5. The semiconductor device according to claim 1, further comprising an insulating resin covering the semiconductor chip, the circuit plate, and the printed circuit board.

6. The semiconductor device according to claim 1, wherein the semiconductor chip comprises a plurality of semiconductor chips forming an upper arm and a lower arm, and the passive element is electrically connected to the semiconductor chip forming the upper arm or the semiconductor chip forming the lower arm.

* * * * *

UNITED STATES PATENT AND TRADEMARK OFFICE
CERTIFICATE OF CORRECTION

PATENT NO. : 9,773,767 B2  
APPLICATION NO. : 14/850339  
DATED : September 26, 2017  
INVENTOR(S) : Yoko Nakamura et al.

Page 1 of 1

It is certified that error appears in the above-identified patent and that said Letters Patent is hereby corrected as shown below:

In the Specification

Please change Column 5, Line 57, from "... metal layers 166r" to --... metal layers 16r--.

Signed and Sealed this  
Twenty-first Day of November, 2017

Joseph Matal  
*Performing the Functions and Duties of the*  
*Under Secretary of Commerce for Intellectual Property and*  
*Director of the United States Patent and Trademark Office*